United States Patent
Wan et al.

(10) Patent No.: US 9,306,019 B2
(45) Date of Patent: Apr. 5, 2016

(54) INTEGRATED CIRCUITS WITH NANOWIRES AND METHODS OF MANUFACTURING THE SAME

(71) Applicant: GLOBALFOUNDRIES, Inc., Grand Cayman (KY)

(72) Inventors: Jing Wan, Malta, NY (US); Guillaume Bouche, Albany, NY (US); Andy Wei, Queensbury, NY (US); Shao Ming Koh, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/457,934

(22) Filed: Aug. 12, 2014

(65) Prior Publication Data

US 2016/0049489 A1    Feb. 18, 2016

(51) Int. Cl.
*H01L 29/423*    (2006.01)
*H01L 29/66*    (2006.01)
*H01L 29/78*    (2006.01)

(52) U.S. Cl.
CPC .... *H01L 29/42392* (2013.01); *H01L 29/66795* (2013.01); *H01L 29/785* (2013.01)

(58) Field of Classification Search
CPC .................. H01L 29/42392; H01L 29/66795; H01L 29/845; H01L 29/41791; H01L 29/6681; H01L 29/66818; H01L 29/785–29/7856; H01L 2029/7857; H01L 2029/7858; H01L 27/10826; H01L 27/0924; H01L 27/0886; H01L 27/1211; H01L 21/845; H01L 21/823431; H01L 21/823821
See application file for complete search history.

(56) References Cited

U.S. PATENT DOCUMENTS

| | | | |
|---|---|---|---|
| 8,389,416 B2 * | 3/2013 | Luong | 438/714 |
| 8,652,901 B1 * | 2/2014 | Lam et al. | 438/259 |
| 8,728,885 B1 * | 5/2014 | Pham et al. | 438/176 |
| 8,748,940 B1 * | 6/2014 | Rachmady et al. | 257/190 |
| 8,778,768 B1 * | 7/2014 | Chang et al. | 438/303 |
| 8,841,189 B1 * | 9/2014 | Cheng et al. | 438/283 |
| 9,023,705 B1 * | 5/2015 | Paul et al. | 438/283 |
| 9,087,863 B2 * | 7/2015 | Cea et al. | |
| 2002/0167023 A1 * | 11/2002 | Chavarkar et al. | 257/194 |
| 2004/0262690 A1 * | 12/2004 | Coronel et al. | 257/365 |

(Continued)

OTHER PUBLICATIONS

Borel et al., "Isotropic Etching of SiGe Alloys With High Selectivity to Similar Materials", Microelectronic Engineering, 2004, pp. 301-305, vol. 73-74.

(Continued)

*Primary Examiner* — Matthew Landau
*Assistant Examiner* — Grant Withers
(74) *Attorney, Agent, or Firm* — Ingrassia Fisher & Lorenz, P.C.

(57) ABSTRACT

Integrated circuits and methods for producing the same are provided. A method for producing an integrated circuit includes forming a layered fin overlying a substrate, where the layered fin includes an SiGe layer and an Si layer. The SiGe layer and the Si layer alternate along a height of the layered fin. A dummy gate is formed overlying the substrate and the layered fin, and a source and a drain area formed in contact with the layered fin. The dummy gate is removed to expose the SiGe layer and the Si layer, and the Si layer is removed to produce an SiGe nanowire. A high K dielectric layer that encases the SiGe nanowire between the source and the drain is formed, and a replacement metal gate is formed so that the replacement metal gate encases the high K dielectric layer and the SiGe nanowire between the source and drain.

16 Claims, 14 Drawing Sheets

(56) References Cited

U.S. PATENT DOCUMENTS

| | | | |
|---|---|---|---|
| 2005/0112851 A1* | 5/2005 | Lee et al. | 438/497 |
| 2005/0158934 A1* | 7/2005 | Yun et al. | 438/197 |
| 2005/0169096 A1* | 8/2005 | Lee et al. | 365/232 |
| 2006/0049429 A1* | 3/2006 | Kim et al. | 257/213 |
| 2006/0172497 A1* | 8/2006 | Hareland et al. | 438/286 |
| 2006/0216897 A1* | 9/2006 | Lee et al. | 438/282 |
| 2006/0240622 A1* | 10/2006 | Lee et al. | 438/257 |
| 2007/0004124 A1* | 1/2007 | Suk et al. | 438/238 |
| 2007/0020827 A1* | 1/2007 | Buh et al. | 438/157 |
| 2007/0029586 A1* | 2/2007 | Orlowski | 257/287 |
| 2007/0034973 A1* | 2/2007 | Yun et al. | 257/408 |
| 2007/0196973 A1* | 8/2007 | Park | 438/197 |
| 2007/0200178 A1* | 8/2007 | Yun et al. | 257/353 |
| 2008/0017934 A1* | 1/2008 | Kim et al. | 257/401 |
| 2008/0020537 A1* | 1/2008 | Kim et al. | 438/308 |
| 2008/0149919 A1* | 6/2008 | Ernst et al. | 257/24 |
| 2008/0237575 A1* | 10/2008 | Jin et al. | 257/19 |
| 2008/0277691 A1* | 11/2008 | Ernst et al. | 257/192 |
| 2009/0203203 A1* | 8/2009 | Ernst et al. | 438/586 |
| 2010/0207208 A1* | 8/2010 | Bedell et al. | 257/346 |
| 2011/0057163 A1* | 3/2011 | Liu et al. | 257/9 |
| 2011/0062417 A1* | 3/2011 | Iwayama et al. | 257/24 |
| 2011/0291190 A1* | 12/2011 | Xiao et al. | 257/347 |
| 2011/0309333 A1* | 12/2011 | Cheng et al. | 257/24 |
| 2012/0007052 A1* | 1/2012 | Hobbs et al. | 257/24 |
| 2012/0138886 A1* | 6/2012 | Kuhn et al. | 257/9 |
| 2013/0153993 A1* | 6/2013 | Chang et al. | 257/330 |
| 2013/0181274 A1* | 7/2013 | Saitoh et al. | 257/314 |
| 2013/0207079 A1* | 8/2013 | Sleight et al. | 257/24 |
| 2013/0234215 A1* | 9/2013 | Okano | 257/255 |
| 2013/0270512 A1* | 10/2013 | Radosavljevic et al. | 257/9 |
| 2013/0277714 A1* | 10/2013 | Le et al. | 257/190 |
| 2013/0279145 A1* | 10/2013 | Then et al. | 361/820 |
| 2013/0285017 A1* | 10/2013 | Le et al. | 257/27 |
| 2013/0313524 A1* | 11/2013 | De Micheli et al. | 257/29 |
| 2013/0341704 A1* | 12/2013 | Rachmady et al. | 257/327 |
| 2014/0035041 A1* | 2/2014 | Pillarisetty et al. | 257/365 |
| 2014/0042386 A1* | 2/2014 | Cea et al. | 257/9 |
| 2014/0084239 A1* | 3/2014 | Radosavljevic et al. | 257/12 |
| 2014/0084246 A1* | 3/2014 | Pillarisetty et al. | 257/24 |
| 2014/0084343 A1* | 3/2014 | Dewey et al. | 257/192 |
| 2014/0084370 A1* | 3/2014 | Cappellani et al. | 257/347 |
| 2014/0091279 A1* | 4/2014 | Kachian et al. | 257/27 |
| 2014/0091360 A1* | 4/2014 | Pillarisetty et al. | 257/190 |
| 2014/0131660 A1* | 5/2014 | Cea et al. | 257/24 |
| 2014/0151638 A1* | 6/2014 | Chang et al. | 257/27 |
| 2014/0151756 A1* | 6/2014 | Chang et al. | 257/288 |
| 2014/0175515 A1* | 6/2014 | Then et al. | 257/194 |
| 2014/0203327 A1* | 7/2014 | Pillarisetty et al. | 257/192 |
| 2014/0209855 A1* | 7/2014 | Cea et al. | 257/9 |
| 2014/0217502 A1* | 8/2014 | Chang et al. | 257/347 |
| 2014/0225065 A1* | 8/2014 | Rachmady et al. | 257/24 |
| 2014/0264253 A1* | 9/2014 | Kim et al. | 257/9 |
| 2014/0264280 A1* | 9/2014 | Kim et al. | 257/29 |
| 2014/0273423 A1* | 9/2014 | Fronheiser et al. | 438/585 |
| 2014/0312425 A1* | 10/2014 | Adam et al. | 257/352 |
| 2014/0312432 A1* | 10/2014 | Ching et al. | 257/401 |
| 2014/0353574 A1* | 12/2014 | Li et al. | 257/9 |
| 2015/0041899 A1* | 2/2015 | Yang et al. | 257/351 |
| 2015/0129830 A1* | 5/2015 | Sung et al. | 257/9 |

OTHER PUBLICATIONS

Taichi et al., "Relationship Between Mobility and High-k Inteface Properties in Advance Si and SiGe Nanowires", IEEE, 2009, pp. 12.7.1-12.7.4.

* cited by examiner

INTEGRATED CIRCUITS WITH NANOWIRES AND METHODS OF MANUFACTURING THE SAME

TECHNICAL FIELD

The technical field generally relates to integrated circuits and methods for manufacturing integrated circuits, and more particularly relates to integrated circuits with nanowires and methods of manufacturing such integrated circuits.

BACKGROUND

The majority of present day integrated circuits (ICs) are implemented by using a plurality of interconnected field effect transistors (FETs), also called metal oxide semiconductor field effect transistors (MOSFETs or MOS transistors). A FET includes a gate electrode as a control electrode overlying a semiconductor channel and spaced-apart source and drain regions on opposite sides of the channel between which a current can flow. A gate insulator is disposed between the gate electrode and the channel to electrically isolate the gate electrode from the channel. A control voltage applied to the gate electrode controls the flow of current through the channel between the source and drain regions. The FETs are generally "N" or "P" type FETs, ("nFET" or "pFET") where the source and drain for nFETs are implanted with "N" type dopants, and the source and drain for pFETs are implanted with "P" type dopants.

A number of challenges arise as feature sizes of FETs and integrated circuits get smaller. For example, significant downsizing of traditional planar FETs leads to electrostatic issues and electron mobility degradation. Scaled-down planar FETS have shorter gate lengths that make it more difficult to control the channel. New device architectures such as nanowires allows further scaling of the integrated circuits, in part because the gate wraps around the channel and provides better control with lower leakage current, faster operations, and lower output resistance. The "gate all around" structure of a FET with nanowires has advantageous short channel characteristics over the electrostatics that the conventional planar FETs or FinFETs provide. Multiple nanowires can be used in the gate of a FET to increase the current capacity. There are process challenges in enabling large scale fabrication of nanowire FETs because of the size and structure. Hence nanowire FETs have not been incorporated into current integrated circuit manufacturing.

Accordingly, it is desirable to provide integrated circuits and methods of manufacturing integrated circuits with nanowires. In addition, it is desirable to provide integrated circuits with FETs using nanowires, where the FETs are manufactured using techniques that allow for further scaling, such as for the use of fins or replacement metal gates. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods for producing the same are provided. In an exemplary embodiment, a method for producing an integrated circuit includes forming a layered fin overlying a substrate, where the layered fin includes an SiGe layer and an Si layer. The SiGe layer and the Si layer alternate along a height of the layered fin. A dummy gate is formed overlying the substrate and the layered fin, and a source and a drain area formed in contact with the layered fin. The dummy gate is removed to expose the SiGe layer and the Si layer, and the Si layer is removed to produce an SiGe nanowire. A high K dielectric layer that encases the SiGe nanowire between the source and the drain is formed, and a replacement metal gate is formed so that the replacement metal gate encases the high K dielectric layer and the SiGe nanowire between the source and drain.

A method for producing an integrated circuit is provided in another embodiment. A layered fin is formed overlying a fin base, where the layered fin includes an SiGe layer and an Si layer. The SiGe layer and the Si layer alternate along a height of the layered fin, and the base extends over a substrate. A dummy gate is formed overlying the layered fin and the substrate, and a source and a drain are formed in contact with the layered fin. The source and the drain overlie the fin base. An insulating layer is formed overlying the substrate and adjacent to the dummy gate, and the dummy gate is removed to expose a portion of the layered fin. An Si nanowire is formed from the layered fin, where the Si nanowire is suspended between the source and the drain.

An integrated circuit is provided in yet another embodiment. The integrated circuit includes a fin base extending over a substrate, and a source and a drain overlying the fin base. An SiGe nanowire contacts the source and the drain, and a high K dielectric layer encases the SiGe nanowire between the source and the drain. A replacement metal gate encases the high K dielectric layer and the SiGe nanowire between the source and the drain.

BRIEF DESCRIPTION OF THE DRAWINGS

The present embodiments will hereinafter be described in conjunction with the following drawing figures, wherein like numerals denote like elements, and wherein:

FIG. 1 is a side section view of alternating semiconductor materials with a hard or soft mask;

FIG. 2 is a perspective sectional view after the fin etch and formation;

FIG. 3 is a sectional view along plane BB of FIG. 2;

FIG. 4 is a sectional view along plane AA of FIG. 2;

FIG. 5 is a perspective sectional view after the dummy gate deposition and formation;

FIG. 6 is a sectional view along plane CC of FIG. 5;

FIGS. 7-9 are sectional views along plane DD of FIG. 5;

FIG. 10 is a sectional view along plane EE of FIG. 5 after the source and drain epitaxial regrowth;

FIG. 11 is a perspective sectional view after the dummy gate removal;

FIG. 12 is a sectional view along plane GG of FIG. 11;

FIG. 13 is a sectional view along plane FF of FIG. 11;

FIG. 14 is a top view;

FIGS. 15 and 17 are sectional views along plane HH of FIG. 14;

FIGS. 16 and 18 are sectional views along plane JJ of FIG. 14;

FIG. 19 is a top view;

FIG. 20 is a sectional view along plane LL of FIG. 19; and

FIGS. 21 and 22 are sectional views along plane KK of FIG. 19.

DETAILED DESCRIPTION

Figure 1:
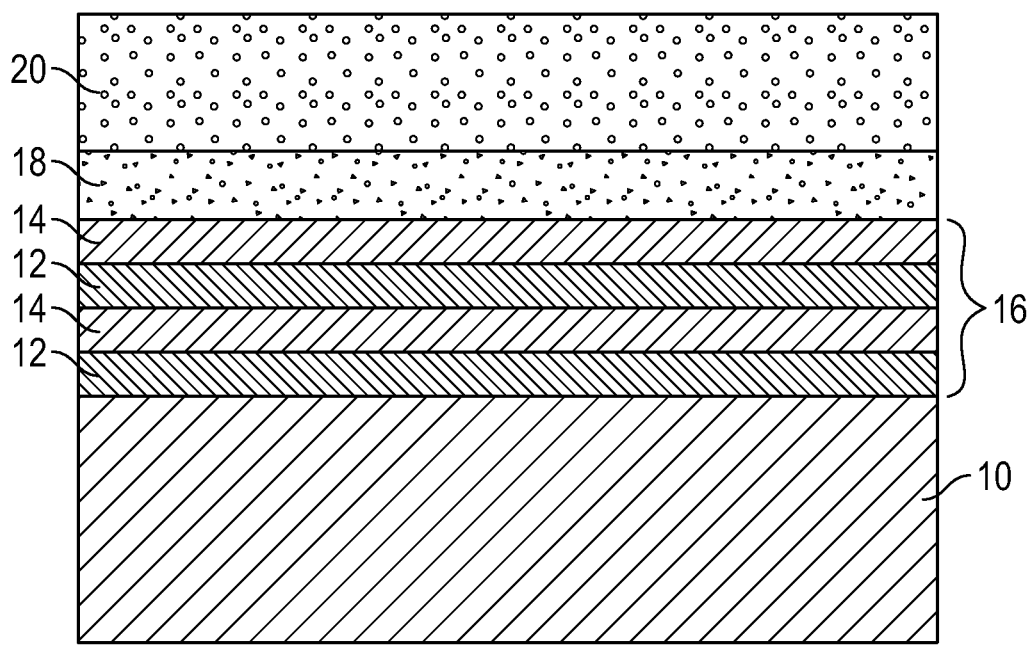
FIGS. 1-22 illustrate portions of an integrated circuit and methods for its fabrication in accordance with exemplary embodiments, where.

The following detailed description is merely exemplary in nature and is not intended to limit the various embodiments or the application and uses thereof. Furthermore, there is no intention to be bound by any theory presented in the preceding background or the following detailed description.

According to various embodiments described herein, FETs with nanowire channels are formed from a layered fin with a replacement metal gate. Alternating layers of semiconductor materials that may be selectively removed or etched relative to its adjoining semiconductor materials are first deposited or epitaxially grown over the starting substrate. The starting substrate can be, but is not limited to, silicon (Si), doped Si, silicon-germanium (SiGe), silicon-carbon (Si:C), silicon-germanium-tin (SiGeSn), germanium (Ge), III-V materials, etc. Here, Si will be used for exemplary illustration. The semiconductor materials may include, but are not limited to, a variety of different materials such as silicon (Si), doped Si, silicon-germanium (SiGe), silicon-carbon (Si:C), silicon-germanium-tin (SiGeSn), germanium (Ge), III-V materials, etc. Portions of the semiconductor materials are sacrificial in nature. Here, SiGe and Si will be used for exemplary illustration. Alternating layers of silicon and silicon/germanium deposited overlying a substrate are etched to form layered fins with a fin base, where the fin base is formed from the substrate material. The alternating layers of Si and SiGe are vertically spaced on the layered fin. A sacrificial "dummy" gate is formed over and beside the layered fin between the source and drain. A sidewall spacer may be formed beside the dummy gate by depositing a spacer material such as silicon nitride followed by an anisotropic etch. The ends of the layered fin are removed to form a source cavity and a drain cavity, and a source and drain are epitaxially grown in the source and drain cavities, respectively. An insulating layer is formed overlying the substrate and between adjacent dummy gates. An etch process is performed to expose the dummy gate. The etch process may consist of a dry or a wet etch or a combination of both. The dummy gate is then removed, so the portion of the layered fins that were under the dummy gate are exposed, but other portions of the layered fins are covered by the insulating layer. The Si layer of the exposed portion of the layered fin is then selectively etched to form a SiGe nanowire from the SiGe layer, where the SiGe nanowire is suspended between the source and the drain. The SiGe layer can then be selectively removed in a similar manner as the Si layer to produce an Si nanowire. The SiGe nanowire forms the channel for a "P" type FET (a pFET), and the Si nanowire is the channel for an "N" type FET (an nFET). The nFET is masked while forming the SiGe nanowires, and pFET is masked while forming the Si nanowires. A high K dielectric layer is formed about the suspended nanowires, and a replacement metal gate is formed about the high K dielectric layer and the suspended nanowires to produce the nFET and the pFET. In this manner, FETs with nanowire channels are formed from a fin structure with high K dielectric layers and replacement metal gates.

Referring to FIG. 1, an SiGe layer 12 is formed overlying a substrate 10, and an Si layer 14 is formed overlying the SiGe layer 12. As used herein, the term "substrate" 10 encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the substrate 10 is a monocrystalline silicon material. The silicon substrate 10 may be a bulk silicon wafer (as illustrated) or may be a thin layer of silicon on an insulating layer (commonly known as silicon-on-insulator or SOI) that, in turn, is supported by a carrier wafer.

In an exemplary embodiment, the SiGe layer 12 is formed from a mixture of silicon and germanium that is deposited by epitaxial growth with a mixture of silane and germane such that the SiGe layer 12 has a monocrystalline structure. The SiGe layer 12 may directly contact the substrate 10 as the first of the SiGe and Si layers 12, 14. In an exemplary embodiment, the SiGe layer 12 is about 10 to about 90 mole percent germanium, and about 10 to about 90 mole percent silicon. In alternate embodiments, the SiGe layer 12 is about 10 to about 50 mole percent germanium, and about 50 to about 90 mole percent silicon, or about 15 to about 30 mole percent germanium and about 70 to about 85 mole percent silicon. The SiGe layer 12 is eventually used as a channel for a pFET, so the SiGe layer 12 may also include "N" type dopants. "N" type dopants include arsenic or phosphorous, but antimony, other materials, or combinations thereof can also be used, and different components may be implanted with the same or different "N" type dopants in various embodiments.

In a similar manner, the Si layer 14 is by epitaxial growth with silane. In an exemplary embodiment, the Si layer 14 is about 95 mole percent or more silicon, or about 98 mole percent silicon or about 99 mole percent silicon in alternate embodiments. The Si layer 14 eventually is formed into the channel for an nFET, so the Si layer 14 may include "P" type dopants. "P" type dopants include boron, aluminum, gallium, and indium, but other materials or combinations of materials can also be used, and different components may be implanted with the same or different "P" type dopants in various embodiments. A plurality of alternating SiGe layers 12 and Si layers 14 are formed overlying the substrate 10 in some embodiments. The alternating SiGe layers 12 and Si layers 14 overlying the substrate 10 produce a layered stack 16.

Figure 2:
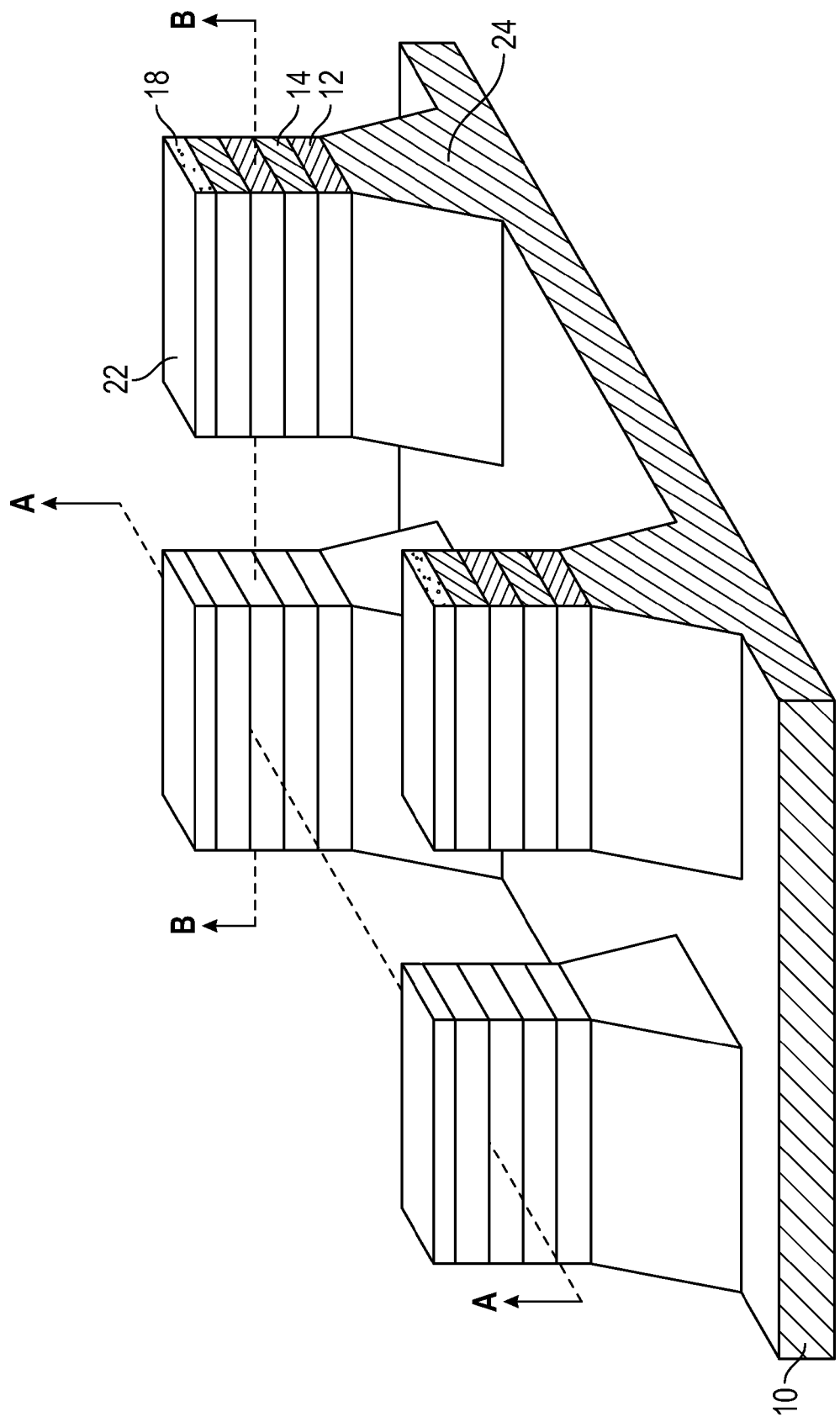

Referring to FIG. 2, with continuing reference to FIG. 1, a layered fin 22 is formed from the layered stack 16. In an exemplary embodiment, a stack hard mask 18 is formed overlying the layered stack 16, and a stack photoresist 20 is formed overlying the stack hard mask 18. The stack hard mask 18 may be silicon nitride, which can be deposited by low pressure chemical vapor deposition using ammonia and dichlorosilane, but other materials can be used in alternate embodiments. The stack photoresist 20 and stack hard mask 18 are then patterned and etched to leave the stack hard mask 18 overlying the layered fin 22, as understood by those skilled in the art. The layered stack 16 is removed except for where it is protected by the remaining stack hard mask 18 to form a plurality of layered fins 22. The layered stack 16 can be removed with an anisotropic reactive ion etch using a fluorine-containing material, such as sulfur hexafluoride, but other etches are also possible. The layered fin 22 includes the SiGe layers 12 and the Si layers 14 alternating along a height of the layered fin 22, and a fin base 24 under the alternating SiGe layers 12 and Si layers 14. The fin base 24 is the same material as the substrate 10, because the fin base 24 is formed by etching the semiconductor material of the substrate 10 adjacent to the layered fin 22. Therefore, the fin base 24 is monocrystalline silicon in some embodiments. The substrate 10 is recessed adjacent to the layered fins 22, so the fin base 24 extends over the substrate 10.

Figure 3:
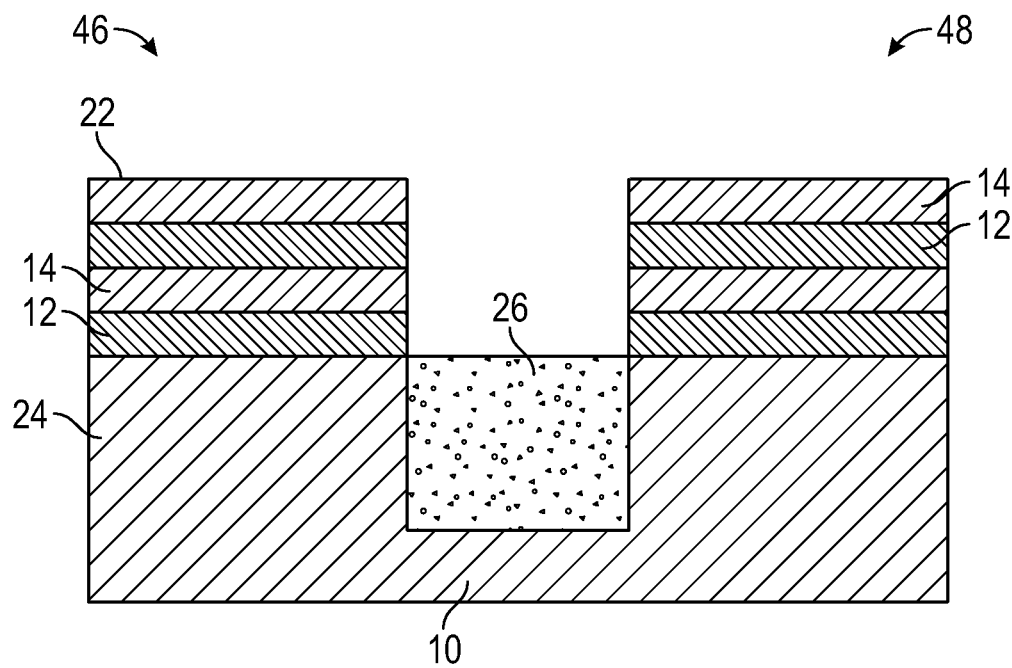
Figure 4:
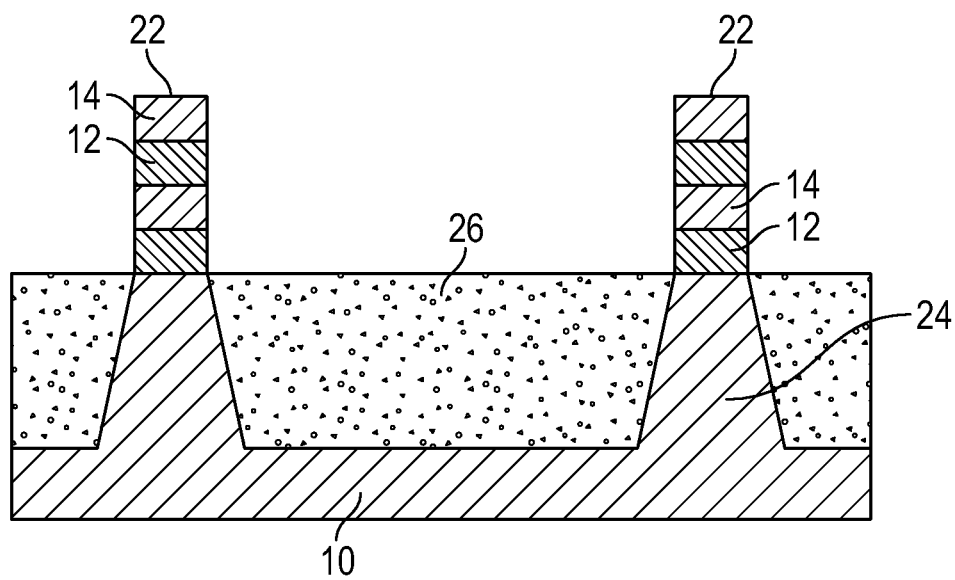

A shallow trench isolation (STI) insulator 26 is formed between adjacent layered fins 22, as illustrated in exemplary embodiments in FIGS. 3 and 4, where FIG. 3 is taken along plane BB of FIG. 2, and FIG. 4 is taken along plane AA of FIG. 2. The STI insulator 26 is silicon oxide in some embodiments, which may be deposited by chemical vapor deposition using silane and oxygen. The STI insulator 26 is then recessed such that the layered fins 22 extend over the STI insulator 26. The STI insulator 26 may be partially recessed, such as to about a level equal to the top of the layered fin 22, with chemical mechanical planarization. The STI insulator 26 may then be further recessed with an etchant selective to silicon oxide over the silicon and silicon germanium of the SiGe layers 12 and the Si layers 14. A wet etch with buffered hydrogen fluoride preferentially removes silicon oxide over silicon or silicon germanium, and the duration of the etch and the concentration of the etchant can be tailored to recess the STI insulator 26 to the desired height. In an exemplary embodiment, the STI insulator 26 is recessed to a level about even with the top of the fin base 24, such as within about 5 nanometers of the top of the fin base 24, but the STI insulator 26 may be recessed to different levels in other embodiments. The stack hard mask 18 illustrated in FIGS. 1 and 2 that remains over the layered fins 22 can then be removed, such as with an etchant selective to silicon nitride over silicon, silicon germanium, and silicon oxide. A wet etch with hot phosphoric acid is selective to silicon nitride, for example.

Figure 5:
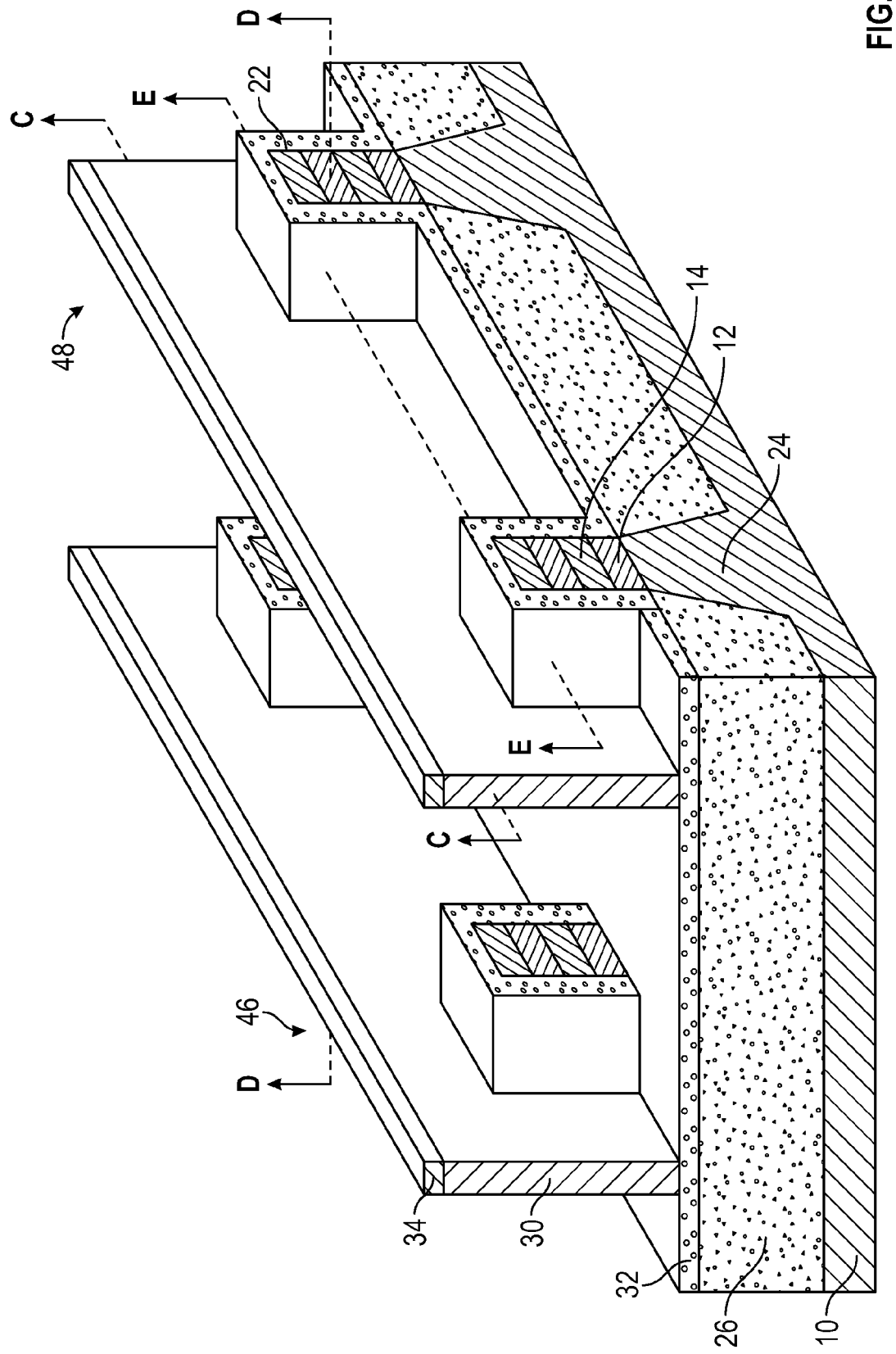
Figure 6:
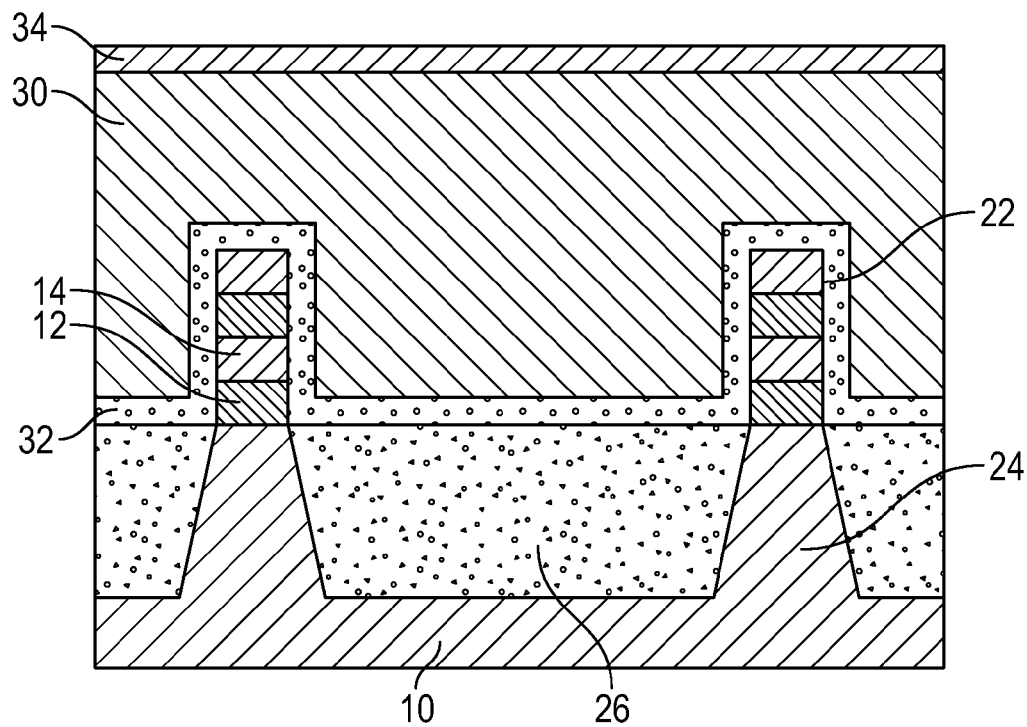

Referring to exemplary embodiments illustrated in FIGS. 5 and 6, where FIG. 6 is taken along plane CC of FIG. 5, a gate barrier layer 32 is formed overlying the layered fins 22 and along a side wall of the layered fins 22. The gate barrier layer 32 may also cover a top surface of the STI insulator 26. In an exemplary embodiment, the gate barrier layer 32 is silicon oxide that is deposited by chemical vapor deposition. The gate barrier layer 32 serves as a protective coating for the layered fin 22, as described further below. After the gate barrier layer 32 is deposited, a dummy gate 30 is formed overlying and the layered fins 22 and adjacent to the side walls of the layered fins 22. In an exemplary embodiment, the dummy gate 30 is formed by depositing polysilicon overlying the layered fins 22, the substrate 10, the STI insulator 26, and the gate barrier layer 32. A dummy gate hard mask 34 is then formed overlying the polysilicon, and patterned with photoresist (not illustrated) to leave the dummy gate hard mask 34 overlying the portion of the polysilicon to form the dummy gate 30. The polysilicon is then selectively etched anisotropically to leave the dummy gate 30 overlying a central portion of the layered fins 22, as well as overlying a portion of the STI insulator 26, as illustrated.

Figure 7:
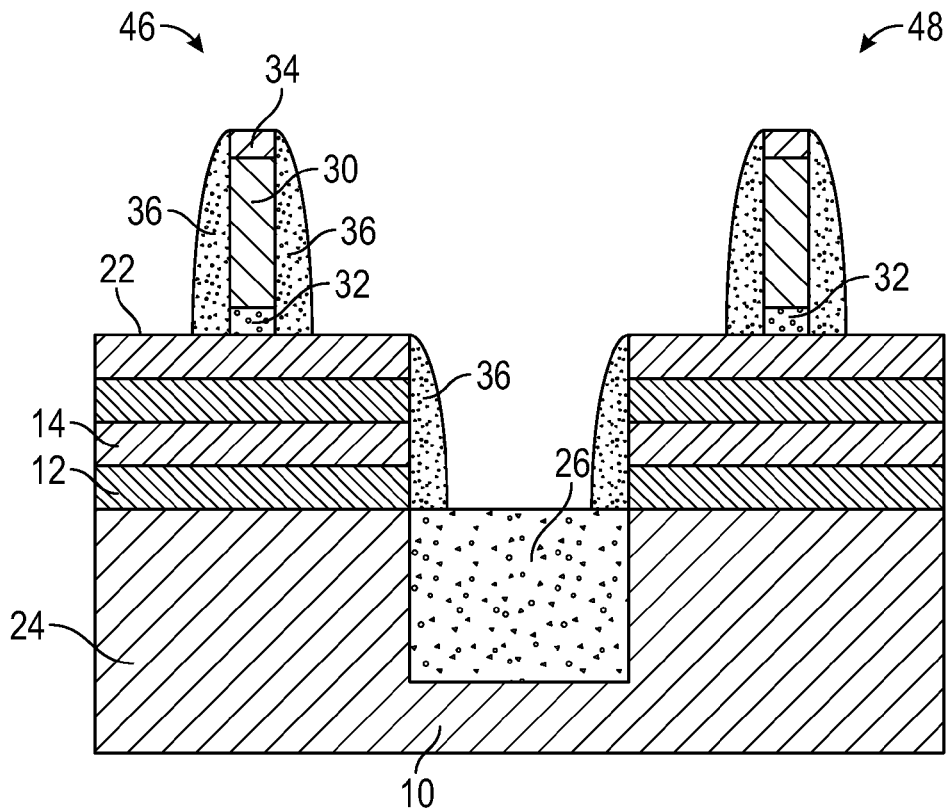

The gate barrier layer 32 is then removed except for where it is protected by the dummy gate 30, and spacers 36 are formed on opposite sides and adjacent to the dummy gate 30, as illustrated in an exemplary embodiment in FIG. 7 where FIG. 7 is taken along plane DD from FIG. 5. The gate barrier layer 32 over the uncovered fins is removed with a wet etch using diluted hydrofluoric acid. The gate barrier layer 32 remains underlying the dummy gate 30. The spacers 36 can be formed by depositing silicon nitride overlying the layered fins 22 and the STI insulator 26, and then anisotropically etching the silicon nitride to leave spacers 36 next to vertical surfaces. Spacers 36 are formed adjacent to the dummy gate 30 and the layered fin 22.

Figure 8:
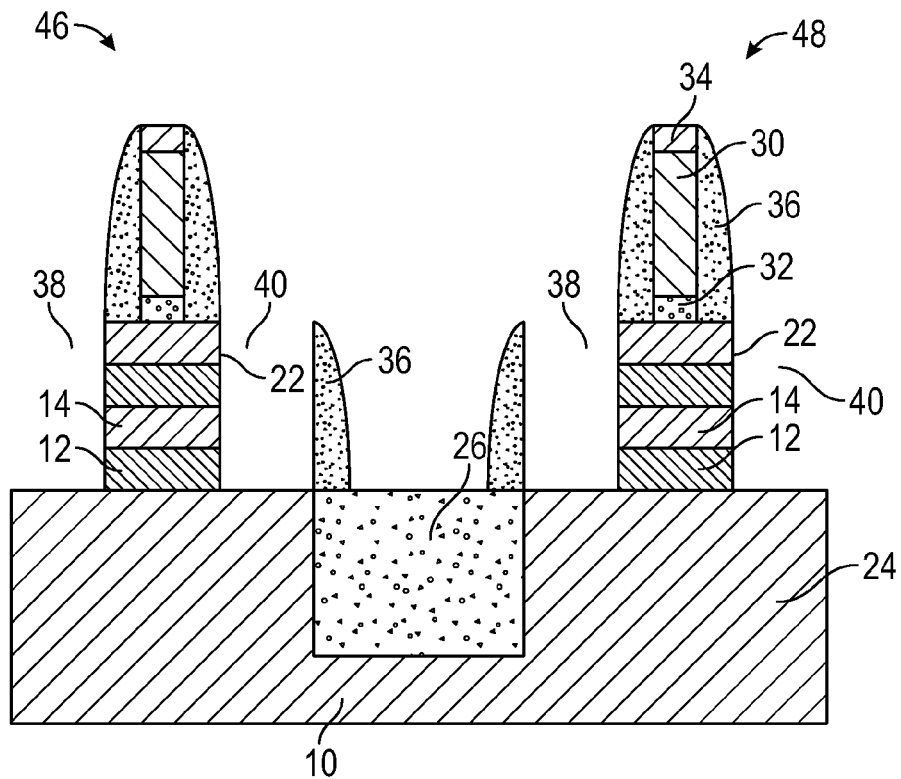

Reference is made to the exemplary embodiment in FIG. 8, which is taken along plane DD from FIG. 5. The ends of the layered fin 22 that extend beyond the spacers 36 are removed to form a source cavity 38 and a drain cavity 40. The ends of the layered fin 22 are removed with an anisotropic etchant that is selective to silicon and silicon germanium over silicon nitride and silicon oxide. An anisotropic reactive ion etch using an etchant such as sulfur fluoride or nitrogen trifluoride and/or a wet etch using nitric acid, water, and ammonium fluoride or other chemistries.

Figure 9:
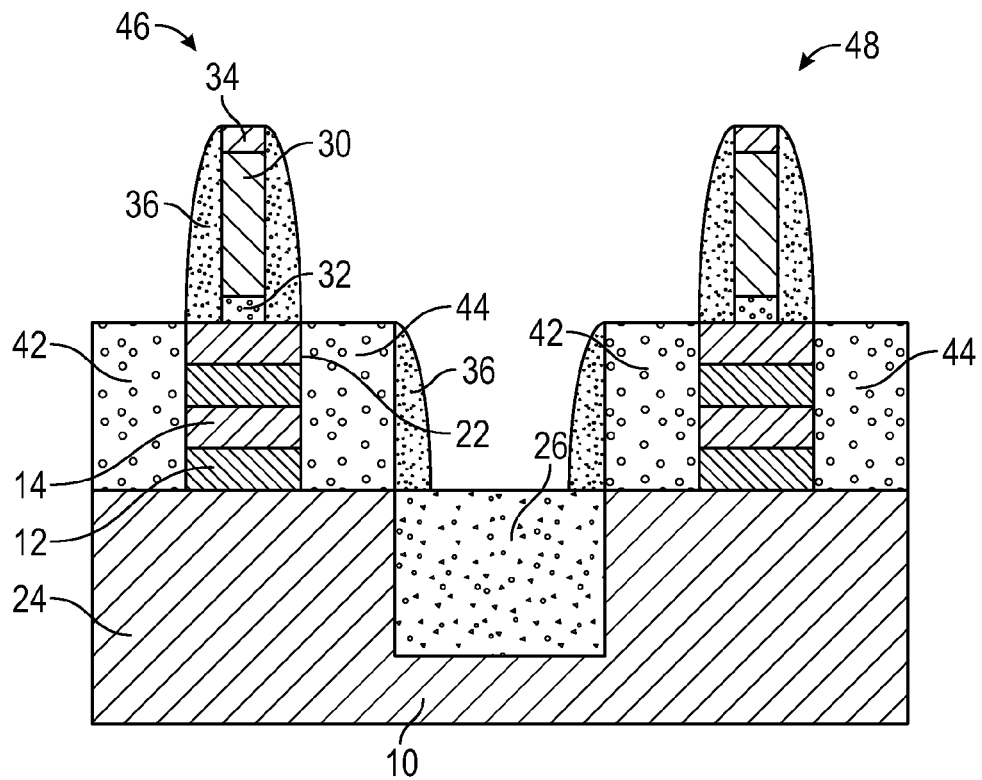
Figure 10:
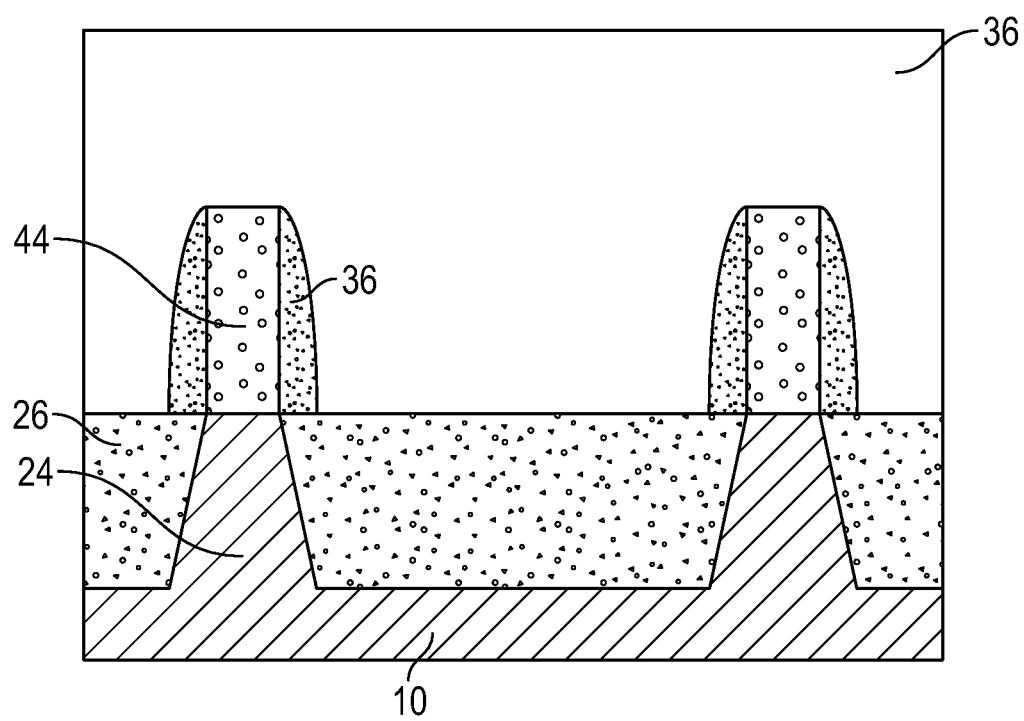

A source 42 and drain 44 are then formed in the source cavity 38 and the drain cavity 40, as illustrated in the exemplary embodiment in FIGS. 9 and 10, with continuing reference to FIG. 8, where FIG. 10 is taken along plane EE from FIG. 5 the source and drain cavities 38, 40 were removed and the source 42 and drain 44 were regrown. The source 42 and drain 44 are epitaxially grown in the source cavity 38 and drain cavity 40, respectively, and overlie the fin base 24. In the illustration, the layered fin 22 on the left will be part of an nFET 46, and the layered fin 22 on the right will be part of a pFET 48. The source 42 and drain 44 for the nFET 46 may be formed of monocrystalline silicon, such as about 95 mole percent monocrystalline silicon, or about 98 mole percent monocrystalline silicon, or about 99 mole percent monocrystalline silicon in various embodiments. The source 42 and drain 44 for the nFET 46 may be grown with "N" type dopants, and the source 42 and drain 44 of the pFET 48 may be grown with "P" type dopants. The source 42 and drain 44 for the pFET 48 may about 10 to about 90 mole percent germanium and about 10 to about 90 mole percent silicon, or about 10 to about 50 mole percent germanium and about 50 to about 90 mole percent silicon, or about 15 to about 30 mole percent germanium and about 70 to about 85 mole percent silicon in various embodiments. In an exemplary embodiment, the nFET 46 is masked during the epitaxial growth of the source 42 and drain 44 for the pFET 48, and the pFET 48 is masked during the epitaxial growth of the source 42 and drain 44 for the nFET 46, such as with a sacrificial hard mask (not illustrated). In an exemplary embodiment, the source 42 and drain 44 are grown by vapor phase epitaxy using disilane (or disilane and germane for the source 42 and drain 44 including germanium), but other types of epitaxy can also be used, such as molecular beam epitaxy. Dopants of the desired type may be added to the source gas during the epitaxial growth. The source 42 and drain 44 do not extend over the STI insulator 26 because epitaxial growth extends from a defined crystal structure, such as in the fin base 24, the SiGe layer 12, and the Si layer 14.

Figure 11:
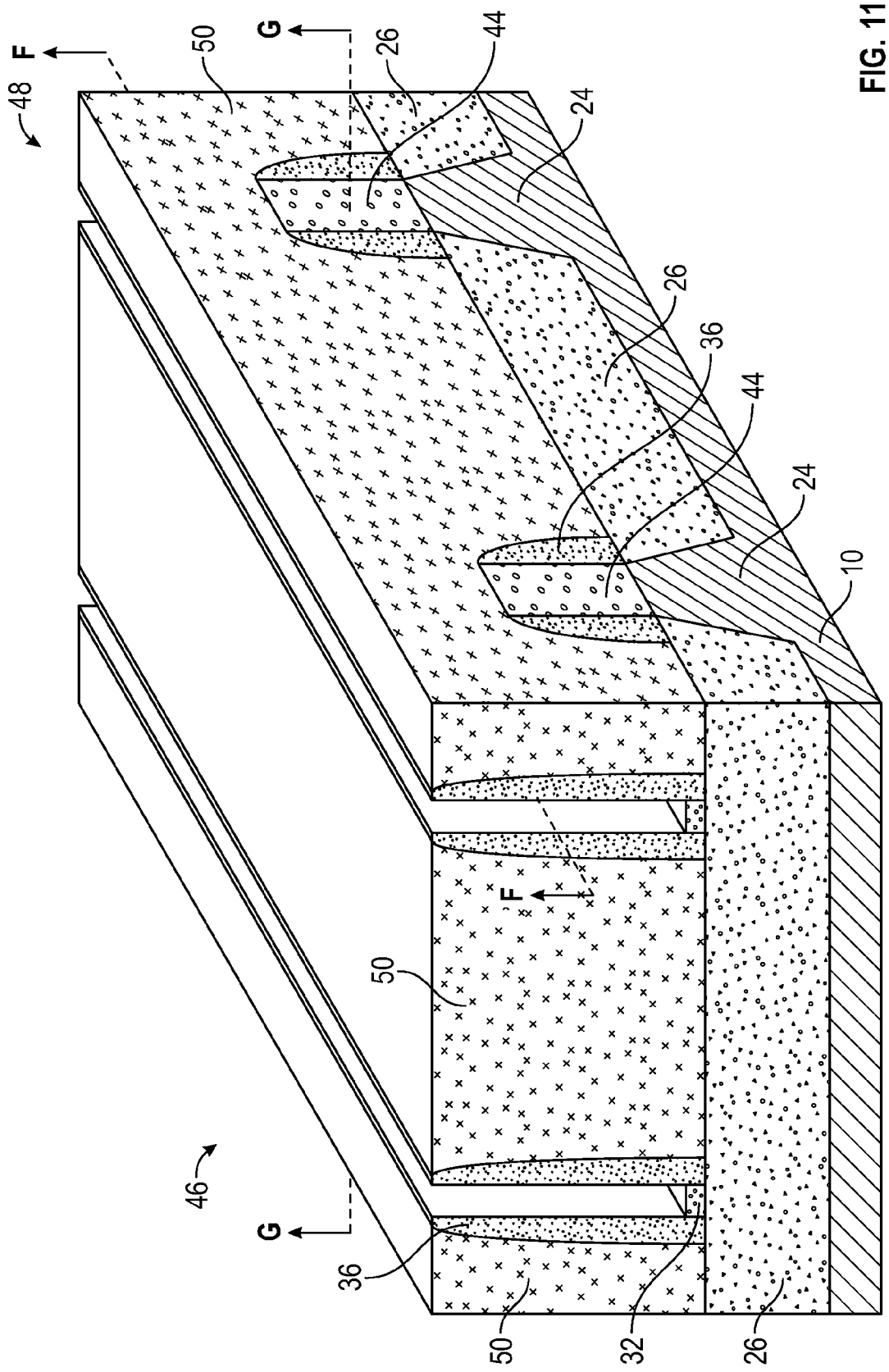
Figure 12:
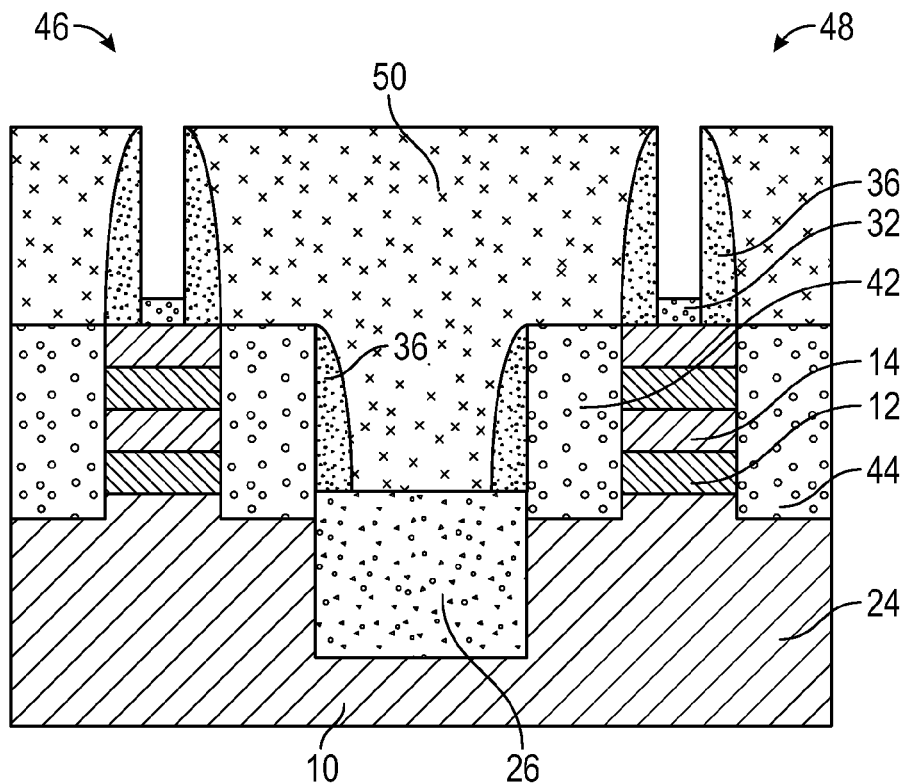
Figure 13:
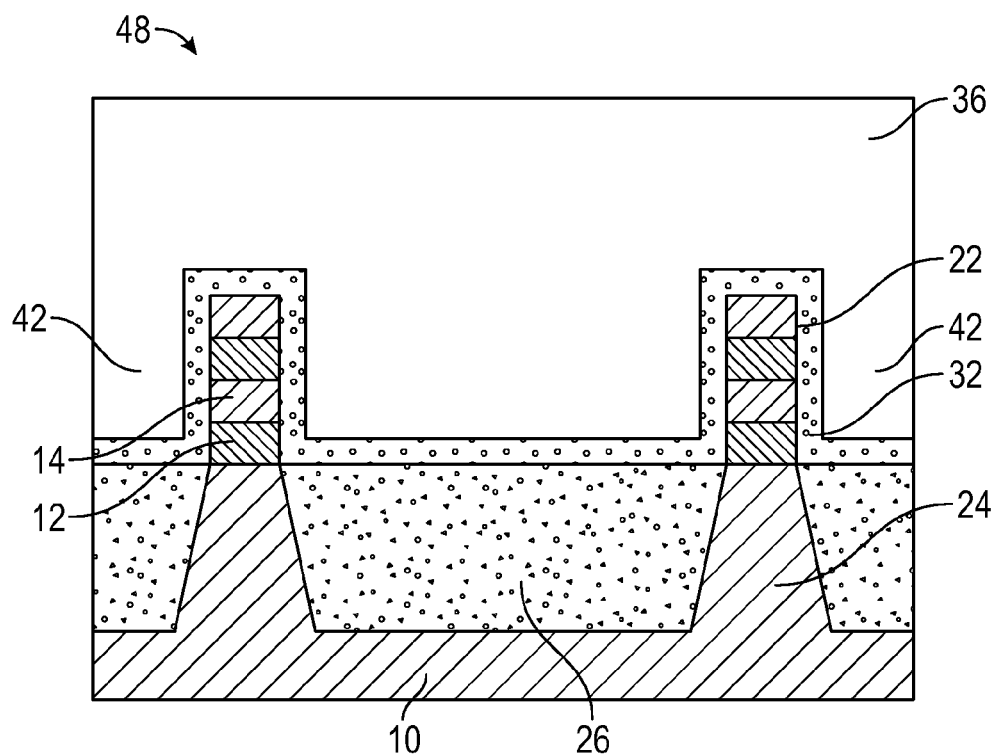

Reference is made to FIGS. 11-13 with continuing reference to FIG. 9, where FIG. 12 is taken along plane GG of FIG. 11, and FIG. 13 is taken along plane FF of FIG. 11 An insulating layer 50 is formed between adjacent dummy gates 30 and overlying a portion of the layered fins 22, the STI insulator 26, and the source 42 and drain 44. The insulating layer 50 may be formed by depositing a silicon and nitrogen containing film using a flowable chemical vapor deposition (FCVD) process, but other materials or processes are used in alternate embodiments. In an exemplary embodiment, the FCVD is a plasma chemical vapor deposition process that can use a low carbon or carbon-free silicon containing precursor that includes silicon along with a nitrogen containing precursor. The silicon precursor may be trisilylamine amine, disilylamine, monosilylamine, silane, or other precursors, and the nitrogen containing precursor may be ammonia, nitrogen gas, or other compounds. The FCVD material can be converted to silicon oxide by infusion with water followed by a steam anneal, which is optionally followed by a dry anneal to densify the silicon oxide. Chemical mechanical planarization then lowers the insulating layer 50 to a level about even with the top of the dummy gate hard mask 34.

The dummy gate 30 is removed after the insulating layer 50 is formed, but the spacers 36 are retained. In an exemplary embodiment, the dummy gate 30 is removed by first etching the dummy gate hard mask 34 with a hot phosphoric acid solution, and then selectively etching the polysilicon dummy gate 30, such as with a reactive ion etch using hydrogen bromide, but other etch chemistries can also be used. The spacers 36 are somewhat protected by the insulating layer 50. Therefore, the spacers 36 are largely left is place from the dummy gate hard mask 34 etch, but some recessing of the spacers 36 may occur. Removal of the dummy gate 30 exposes the portion of the layered fin 22 and the protective gate barrier layer 32 that was covered by the dummy gate 30. The gate barrier layer 32 protects the layered fin 22 from unintended etching during the removal of the dummy gate 30. The insulating layer 50 and the spacer 36 cover the remaining portion of the layered fin 22 as well as the source 42 and drain 44 and the STI insulator 26.

Figure 14:
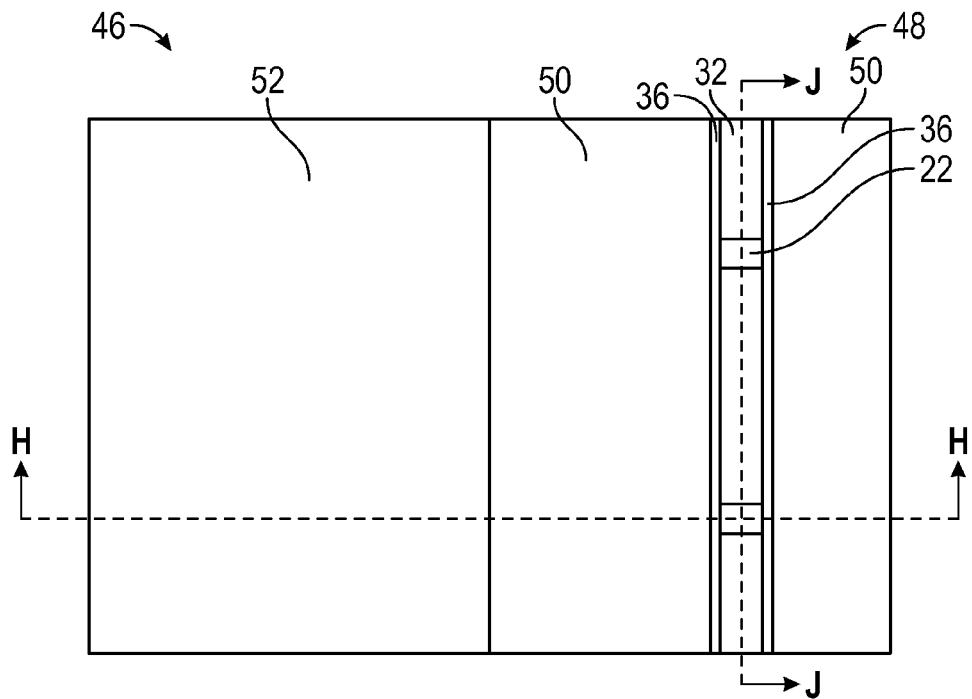
Figure 15:
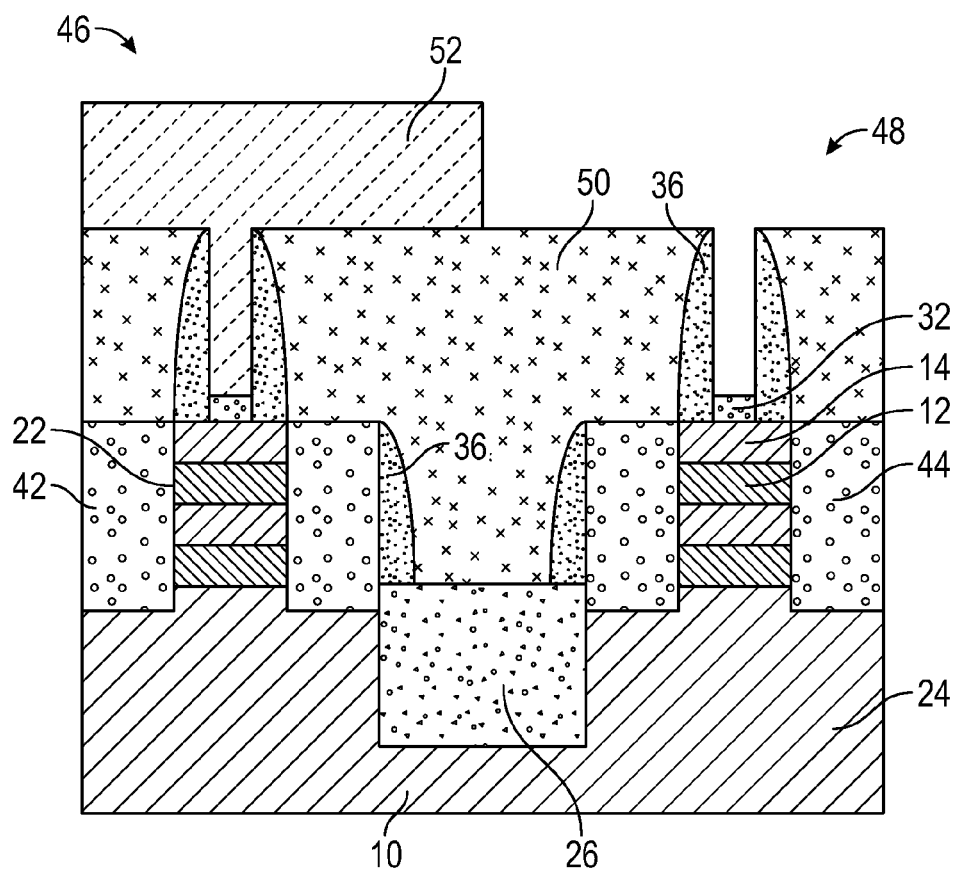
Figure 16:
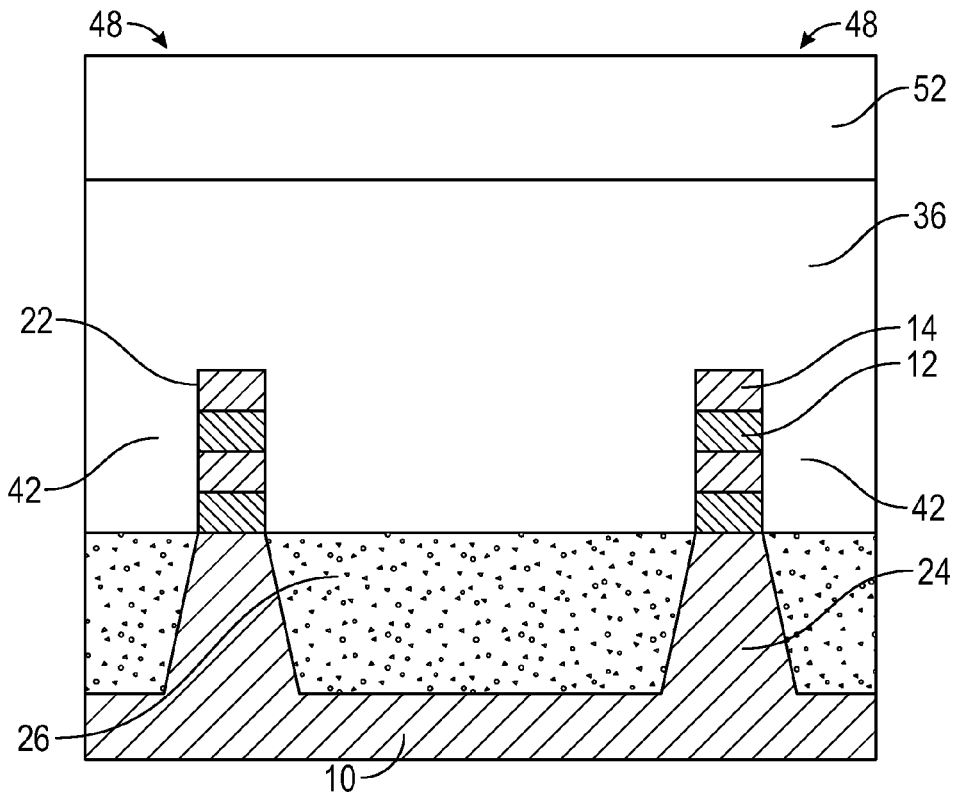

Reference is made to the exemplary embodiment illustrated in FIGS. 14-16, where FIG. 14 is a top view, FIG. 15 is taken along plane HH of FIG. 14 before the gate barrier layer 32 removal, and FIG. 16 is taken along plane JJ of FIG. 14 after the gate barrier layer 32 removal, as described below. The layered fin 22 for the nFET 46 is masked and thereby isolated, such as with an nFET photoresist 52, and the gate barrier layer 32 is removed from the layered fin 22 of the pFET 48 such that the layered fin 22 for the pFET 48 is exposed. A liquid etch with dilute hydrofluoric acid is one possible method of removing the gate barrier layer 32 and thereby exposing the top and side surfaces of the SiGe layers 12 and the Si layers 14 of the layered fin 22 for the pFET 48. The top of the fin base 24 is covered by the SiGe layer 12 and the side surfaces of the fin base 24 are covered by the STI insulator 26. Therefore, the Si layers 14 and the SiGe layers 12 of the layered fin 22 are exposed for further etching, but the fin base 24 is not.

Figure 17:
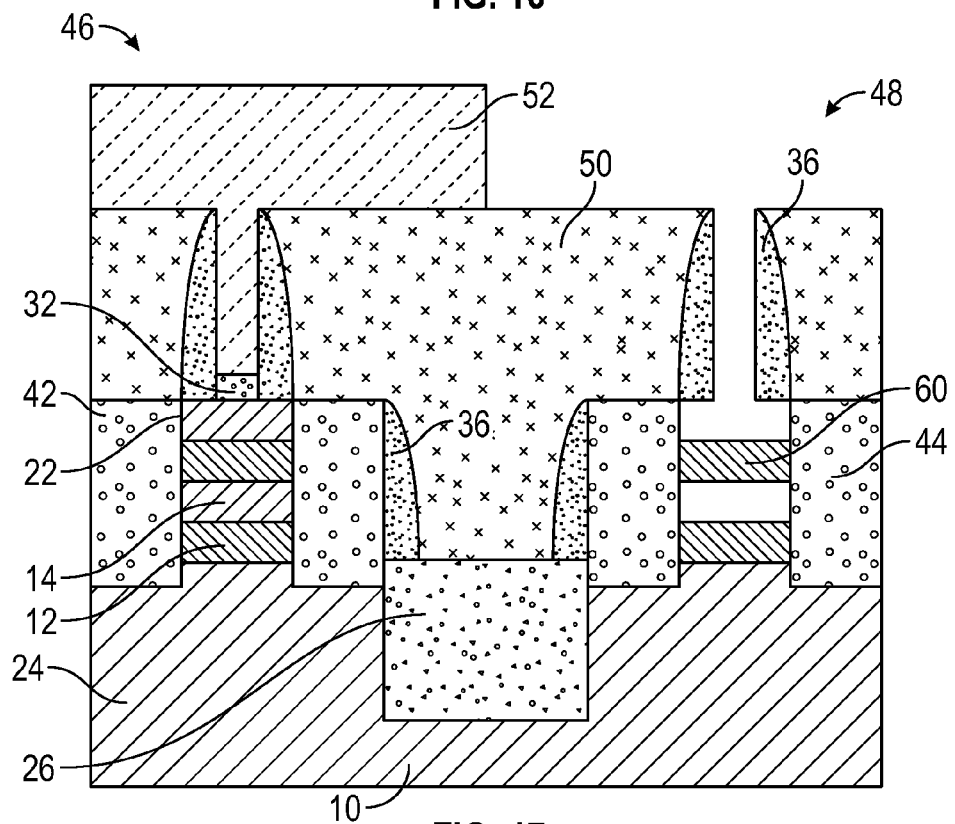
Figure 18:
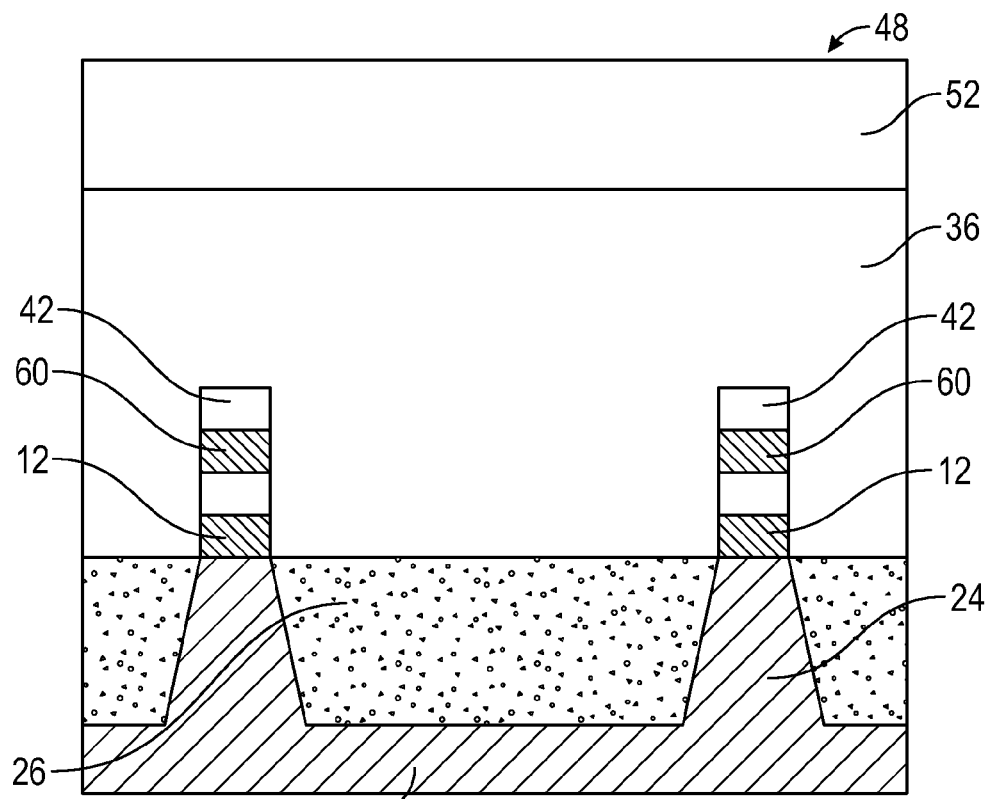

Reference is made to FIGS. 17 and 18, which are the same views as FIGS. 15 and 16, respectively, after the selective etch described below. The Si layers 14 are selectively etched and removed from the layered fin 22 of the pFET 48 to produce SiGe nanowires 60 from the SiGe layers 12 of the layered fin 22. The etchant accesses the Si layers 14 from the top and/or the side surface of the layered fin 22, but the STI insulator 26 and the lowest SiGe layer 12 prevent the etchant from contacting the fin base 24. The Si layers 14 can be selectively etched over the SiGe layers 12, but exposed portions of the SiGe layers 12 are partially removed during the selective etch. The deposition thickness of the Si layers 14 and SiGe layers 12 can be adjusted to account for the relative etch rates when selectively etching the Si layers 14 or the SiGe layers 12. In an exemplary embodiment, the Si layers 14 are selectively etched using a dry plasma etch with hydrogen bromide gas at a flow rate of about 700 standard cubic centimeters per minute (SCCM) and helium at a flow rate of about 300 SCCM. The pressure during the selective etch is about 150 millitorr (mT). Standard conditions for the SCCM are a temperature of zero degrees centigrade (° C.) and a pressure of 1.01 bars. After the selective etch, the SiGe nanowires 60 are suspended between the source 42 and drain 44, so the SiGe nanowires 60 contact the source 42 and drain 44. The source 42 and drain 44 for the pFET 48 is silicon germanium so the etchant removes the Si layer 14 more rapidly than the material of the source 42 and drain 44.

Figure 19:
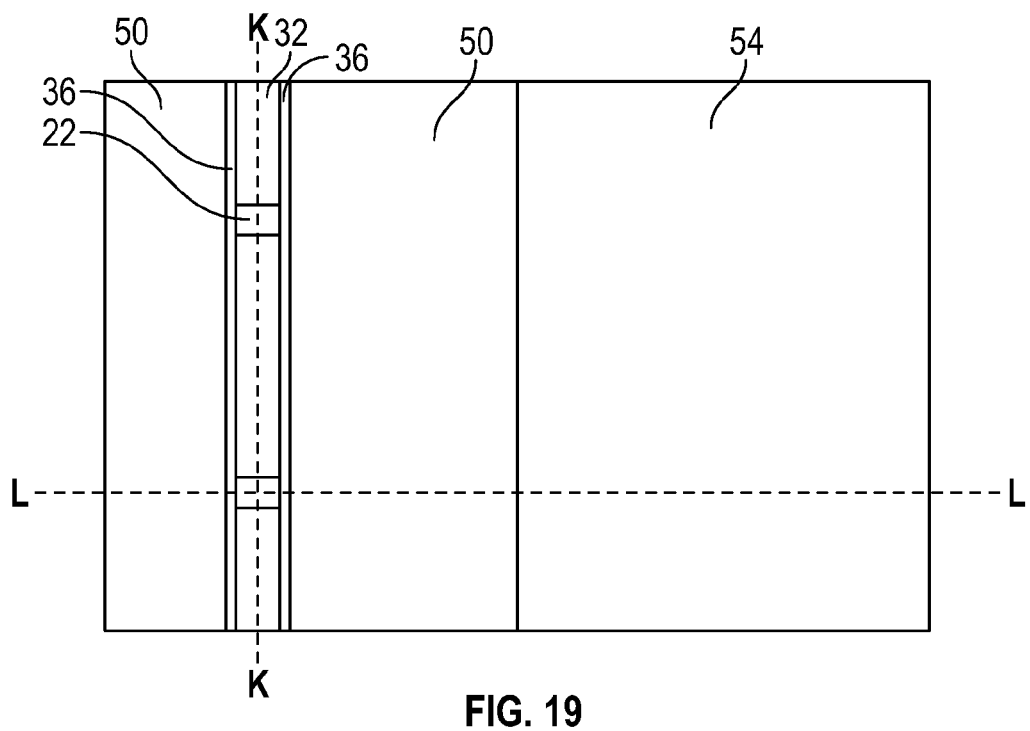
Figure 20:
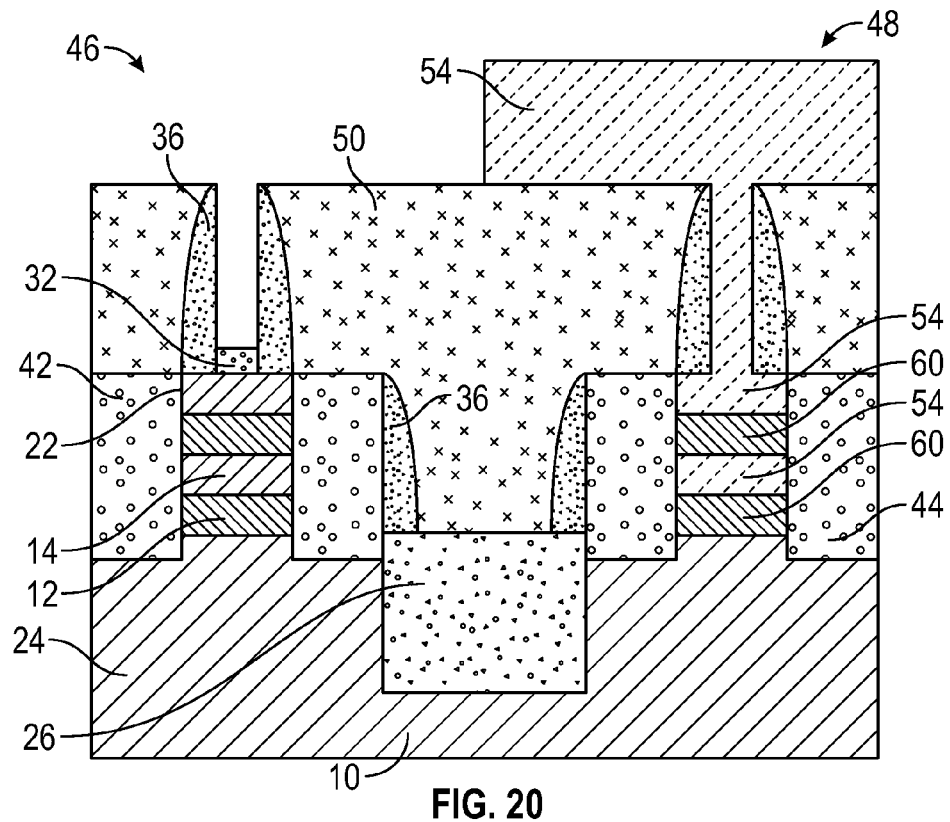
Figure 21:
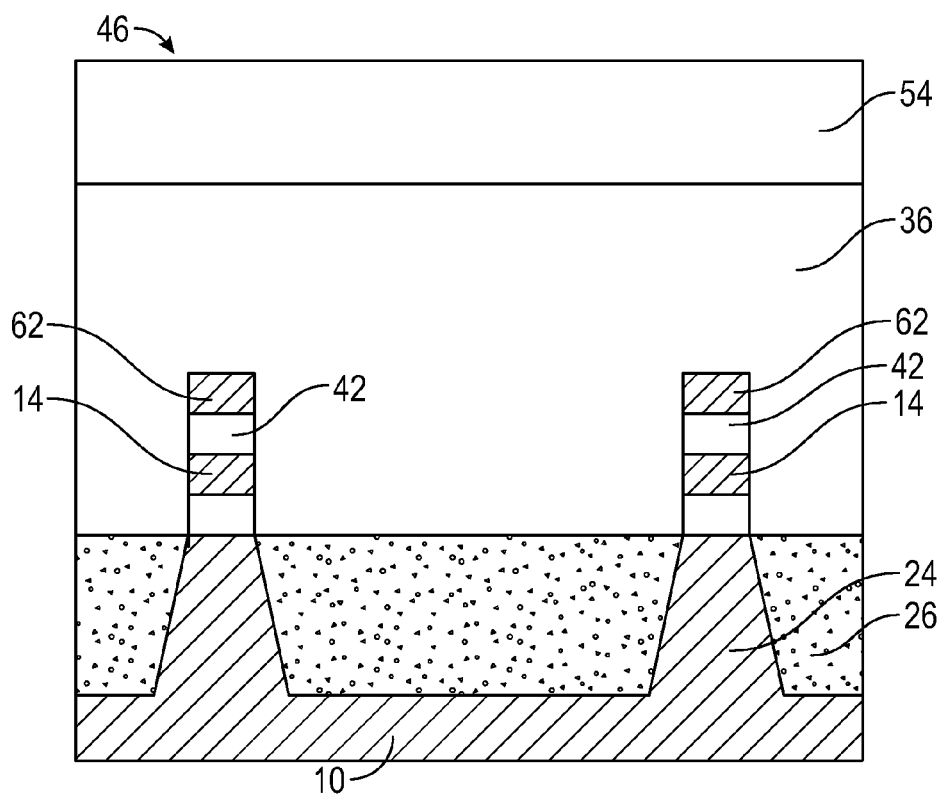

Reference is made to FIGS. 19-21, where FIG. 19 is a top view, FIG. 20 is taken along plane LL from FIG. 19 before the nFET selective etch, and FIG. 21 is taken along plane KK from FIG. 19 after the nFET selective etch, as described below. The nFET photoresist 52 (illustrated in FIGS. 14-18) is removed from over the nFET 46 to expose the layered fin 22 for the nFET 46, and a pFET photoresist 54 is formed overlying the pFET 48 to isolate the SiGe nanowires 60. The gate barrier layer 32 is removed from over the layered fin 22 and the STI insulator 26 of the nFET 46, as described above for the pFET 48, so the side and top surfaces of the layered fin 22 for the nFET 46 are exposed in the area that was covered by the dummy gate 30.

The SiGe layers 12 of the layered fin 22 of the nFET 46 are selectively etched and removed to produce Si nanowires 62 from the Si layers 14. As with the pFET 48 described above, the etchant contacts the exposed top and/or side surfaces of the SiGe layers 12, and the source 42 and drain 44 for the nFET 46 are formed of silicon so the source 42 and drain 44 are not aggressively etched. The fin base 24 is also silicon in an exemplary embodiment, so the exposed fin base 24 is not aggressively etched. After removal of the SiGe layers 12, the remaining Si nanowires 62 are suspended between the source 42 and drain 44 in the nFET 46, similar to the pFET 48 described above. In an exemplary embodiment, the SiGe layers 12 are selectively etched in a dry plasma using carbon tetrafluoride at a flow rate of about 300 SCCM, a pressure of about 350 millitorr, and a microwave power of about 700 watts.

Figure 22:
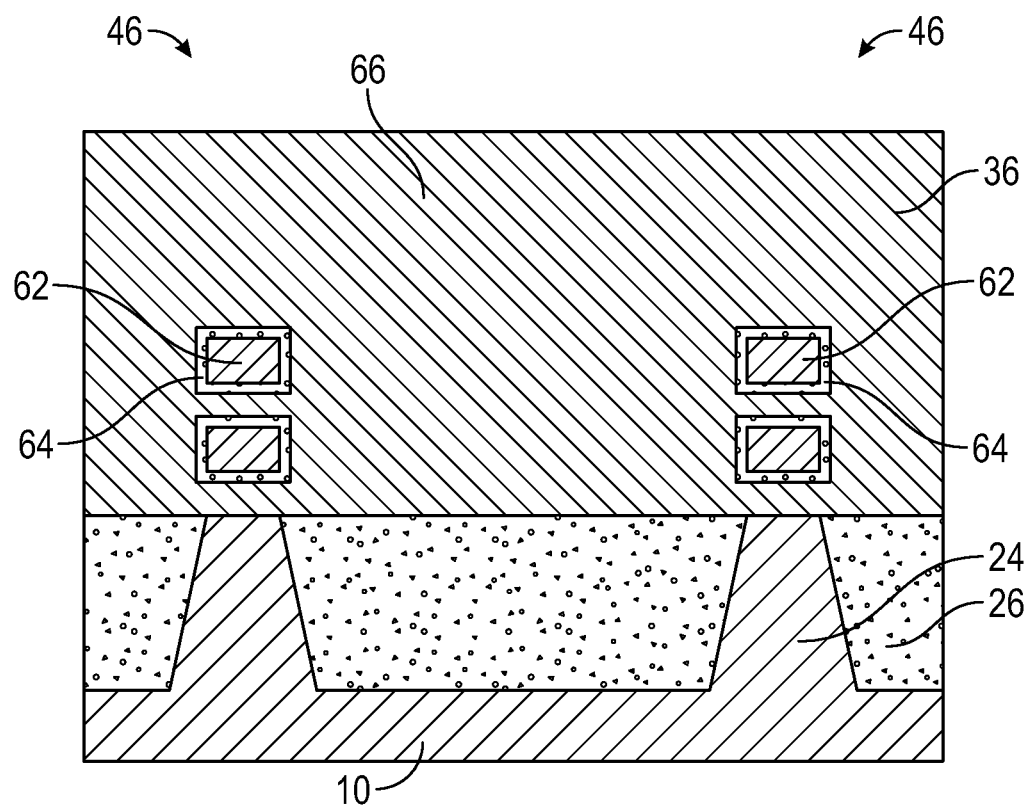

Referring to FIG. 22 with continuing reference to FIGS. 16-21, a high K dielectric layer 64 is formed around the Si nanowires 62 and the SiGe nanowires 60. FIG. 22 illustrates the high K dielectric layer 64 encasing the Si nanowire 62 between the source 42 and the drain 44, and the high K dielectric layer 64 similarly encases the SiGe nanowire 60 (not illustrated) between the source 42 and the drain 44. As used herein, a "high K dielectric" is a dielectric material with a dielectric constant (K) of about 3.7 or greater, where K is the ratio of a material's permittivity $\in$ to the permittivity of vacuum $\in$o, so k=$\in$/$\in$o. Since the dielectric constant is a ratio of two similar quantities, it is dimensionless. The high K dielectric layer 64 may be a wide variety of materials, such as hafnium oxide or zirconium silicate. The high K dielectric layer 64 is formed by atomic layer deposition and wraps around and encases the SiGe nanowires 60 and the Si nanowires 62 between the source 42 and drain 44. A replacement metal gate 66 is then deposited in the space previously occupied by the dummy gate 30. As such, the replacement metal gate 66 is positioned between the spacers 36 and also between the source 42 and drain 44, and the replacement metal gate 66 wraps around and encases the SiGe nanowires 60, the Si nanowires 62, and the high K dielectric layer 64 between the source 42 and drain 44. The replacement metal gate 66 may be tungsten, aluminum, or other metals in various embodiments. For example, an aluminum replacement metal gate 66 may be deposited by atomic layer deposition using triisobutylaluminium. Overburden from the deposition of the replacement metal gate 66 may be removed by chemical mechanical planarization. The nFET 46 and pFET 48 can then be incorporated into an integrated circuit using methods and techniques well known to those skilled in the art.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of manufacturing an integrated circuit comprising:

forming a layered fin overlying a substrate, wherein the layered fin comprises an SiGe layer and an Si layer, wherein the SiGe layer and the Si layer alternate along a height of the layered fin;

forming a gate barrier layer overlying the layered fin and along a side of the layered fin;

forming a dummy gate overlying the substrate and the layered fin such that the gate barrier layer is positioned between the dummy gate and the layered fin;

forming a source and a drain that are in contact with the layered fin;

removing the dummy gate to expose the SiGe layer and the Si layer;

removing the gate barrier layer after removing the dummy gate;

removing the Si layer to produce an SiGe nanowire;

forming a high K dielectric layer encasing the SiGe nanowire between the source and the drain; and forming a replacement metal gate encasing the high K dielectric layer and the SiGe nanowire between the source and the drain.

2. The method of claim 1 further comprising:

isolating the layered fin for an nFET before removing the Si layer to produce the SiGe nanowire;

exposing the layered fin for the nFET after removing the Si layer to produce the SiGe nanowire;

isolating the SiGe nanowire;

removing the SiGe layer of the layered fin for the nFET to produce an Si nanowire;

wherein forming the high K dielectric layer comprises forming the high K dielectric layer encasing the SiGe nanowire between the source and the drain, and forming the high K dielectric layer encasing the Si nanowire between the source and the drain; and wherein forming the replacement metal gate comprises forming the replacement metal gate encasing the high K dielectric layer and the SiGe nanowire between the source and the drain, and forming the replacement metal gate encasing the high K dielectric layer and the Si nanowire between the source and the drain.

3. The method of claim 1 wherein forming the layered fin comprises forming a plurality of layered fins, the method further comprising:

forming an insulating layer between adjacent layered fins and overlying the substrate.

4. The method of claim 1 wherein forming the layered fin comprises forming the layered fin with a fin base, wherein the fin base extends over the substrate.

5. The method of claim 4 further comprising:

forming an STI insulator overlying the substrate and adjacent to the fin base; and wherein forming the dummy gate comprises forming the dummy gate overlying the STI insulator.

6. The method of claim 1 further comprising:

forming spacers on a side of the dummy gate; and wherein removing the dummy gate comprises retaining the spacers.

7. The method of claim 1 further comprising:

forming a layered stack overlying the substrate; and wherein forming the layered fin comprises etching the layered stack and the substrate to form the layered fin such that the layered fin comprises a fin base of the same material as the substrate.

8. The method of claim 1 wherein forming the source and the drain comprises:

etching a portion of the layered fin to form a source cavity and a drain cavity; and epitaxially growing the source and the drain in the source cavity and the drain cavity.

9. The method of claim 8 wherein epitaxially growing the source and the drain comprises epitaxially growing the source wherein the source and the drain are about 10 to about 50 mole percent germanium and about 50 to about 90 mole percent silicon.

10. A method of manufacturing an integrated circuit comprising:

forming a layered stack overlying a substrate;

forming a layered fin overlying a fin base, wherein the layered fin comprises an SiGe layer and an Si layer, wherein the SiGe layer and the Si layer alternate along a height of the layered fin, wherein the fin base extends over the substrate, and wherein forming the layered fin comprises etching the layered stack and the substrate to form the layered fin such that the fin base is formed of the same material as the substrate;

forming a gate barrier layer overlying the layered fin and along a side of the layered fin;

forming a dummy gate overlying the layered fin and the substrate such that the gate barrier layer is positioned between the dummy gate and the layered fin;

forming a source and a drain contacting the layered fin, wherein the source and the drain overlie the fin base;

forming an insulating layer overlying the substrate and adjacent to the dummy gate;

removing the dummy gate to expose a portion of the layered fin;

removing the gate barrier layer after removing the dummy gate; and forming an Si nanowire from the layered fin, where the Si nanowire is suspended between the source and the drain.

11. The method of claim 10 further comprising:

isolating the layered fin for a pFET before forming the Si nanowire;

exposing the layered fin for the pFET after forming the Si nanowire;

isolating the Si nanowire; and forming an SiGe nanowire from the layered fin for the pFET.

12. The method of claim 10 wherein forming the source and the drain comprises:

etching a portion of the layered fin to form a source cavity and a drain cavity; and epitaxially growing the source and the drain in the source cavity and the drain cavity, respectively.

13. The method of claim 10 further comprising:

forming a high K dielectric layer encasing the Si nanowire between the source and the drain; and forming a replacement metal gate encasing the high K dielectric layer and the Si nanowire between the source and the drain.

14. The method of claim 10 wherein forming the Si nanowire comprises selectively etching the SiGe layer to form the Si nanowire from the Si layer.

15. The method of claim 10 further comprising:

forming spacers on a side of the dummy gate; and wherein removing the dummy gate comprises retaining the spacers.

16. A method of manufacturing an integrated circuit comprising:

forming a layered fin overlying a substrate, wherein the layered fin comprises an SiGe layer and an Si layer, wherein the SiGe layer and the Si layer alternate along a height of the layered fin;

forming a dummy gate overlying the substrate and the layered fin;

forming a source and a drain that are in contact with the layered fin;

removing the dummy gate to expose the SiGe layer and the Si layer;

isolating the layered fin for an nFET, wherein the nFET comprises an SiGe nanowire;

removing the Si layer to produce the SiGe nanowire;

exposing the layered fin for the nFET after removing the Si layer to produce the SiGe nanowire;

isolating the SiGe nanowire;

removing the SiGe layer of the layered fin for the nFET to produce an Si nanowire;

forming a high K dielectric layer encasing the SiGe nanowire between the source and the drain, and wherein the high K dielectric layer encases the Si nanowire between the source and the drain; and forming a replacement metal gate encasing the high K dielectric layer and the SiGe nanowire between the source and the drain, and wherein the replacement metal gate encases the high K dielectric layer and the Si nanowire between the source and the drain.

* * * * *